United States Patent [19]
Gorman

[11] Patent Number: 5,796,148
[45] Date of Patent: Aug. 18, 1998

[54] INTEGRATED CIRCUITS

[75] Inventor: Christopher Gorman, Ballykeefe, Ireland

[73] Assignee: Analog Devices, Inc., Norwood, Mass.

[21] Appl. No.: 644,685

[22] Filed: May 31, 1996

[51] Int. Cl.$^6$ .............................. H01L 27/10; H01L 27/15
[52] U.S. Cl. ........................... 257/379; 257/528; 257/532
[58] Field of Search ................................... 257/379, 528, 257/48, 202–211, 300, 532

[56] References Cited

U.S. PATENT DOCUMENTS

| | | | |
|---|---|---|---|
| 5,250,853 | 10/1993 | Bacigalupo | 307/272.3 |
| 5,272,098 | 12/1993 | Smayling et al. | 437/41 |
| 5,275,961 | 1/1994 | Smayling et al. | 437/41 |
| 5,311,048 | 5/1994 | Takahashi et al. | 257/207 |
| 5,323,048 | 6/1994 | Onuma | 257/205 |
| 5,378,919 | 1/1995 | Ochiai | 257/204 |
| 5,448,092 | 9/1995 | Okabe et al. | 257/379 |
| 5,506,158 | 4/1996 | Eklund | 257/379 |
| 5,576,565 | 11/1996 | Yamaguchi et al. | 257/300 |

*Primary Examiner*—Donald Monin
*Attorney, Agent, or Firm*—Fish & Richardson P.C.

[57] ABSTRACT

An integrated circuit chip is provided having an electrical circuit formed therein. A plurality of devices is formed in an active device region of the chip, such devices being connected as active devices. A plurality of additional ones such device are formed in a region adjacent to the active device region, such additional ones of the devices being connected as passive devices. The additional devices provide a dual purpose: first there presence improves the electrical characteristic matching among the devices which are to provide the active devices for the circuit; and, second, they are available to provide passive devices for use by the circuit rather then merely taking up space as a mere "dummy" previously unused by the circuit. More particularly, a plurality of first devices is formed in an active device region of the chip to provide the active devices. Each one of such first devices has the same shape and size. Each one of the first devices is laterally separated from an adjacent one of the first devices by a predetermined distance. A plurality of second devices is formed in a region adjacent to the active device region to provide the passive devices. Each one of the second devices has the same shape and size as the first devices. Each one of the second devices is separated from an adjacent one of the first devices by the predetermined distance.

22 Claims, 4 Drawing Sheets

1

INTEGRATED CIRCUITS

BACKGROUND OF THE INVENTION

This invention relates generally to integrated circuits and more particularly to integrated circuits wherein an array of active devices is formed in a region of an integrated circuit chip and wherein additional, non-active, or so-called "dummy" devices, are formed about potions of the periphery of the active device region to improve matching of electrical characteristics among the active devices in such active device region.

As is known in the art, in applications where active devices are required to have accurately matched electrical characteristics, such as, for example, when metal oxide silicon (MOS) devices are used as current sources in a digital to analog converter (DAC), it is common practice to place "dummy" devices beside periphery of the active device region where the active devices are to be formed. These "dummy" devices have no electrical purpose (i.e., they are not used in the DAC or other electrical circuit formed on the chip); rather, they are used to ensure that immediate surroundings of all active devices in the active device requiring matching have the same "matched" electrical properties.

SUMMARY OF THE INVENTION

In accordance with the present invention, an integrated circuit chip is provided having an electrical circuit formed therein. A plurality of devices is formed in an active device region of the chip, such devices being connected as active devices. A plurality of additional ones such devices is formed in a region adjacent to the active device region, such additional ones of the devices being connected as passive devices.

With such an arrangement, the additional devices provide a dual purpose: first, their presence improves the electrical characteristic matching among the devices which are to provide the active devices for the circuit; and, second, they are available to provide passive devices for use by the circuit rather than merely taking up space as a mere "dummy" previously unused by the circuit.

In accordance with another feature of the invention, an integrated circuit chip having an electrical circuit formed therein is provided. A plurality of first devices is formed in an active device region of the chip, each one of such first devices having the same shape and size. Each one of first devices is laterally separated from an adjacent one of the first devices by a predetermined distance. The first devices are connected as active devices for the electrical circuit. A plurality of second devices is formed in a region adjacent to the active device region. Each one of such second devices has the same shape and size as the first devices. Each one of the second devices is separated from an adjacent one of the first devices by the predetermined distance. The second devices are connected as passive devices for the electrical circuit.

In a preferred embodiment of the invention, an integrated circuit chip having an electrical circuit formed therein is provided. A plurality of first MOS devices having matched electrical characteristics is formed on an active device region of the chip. Each one of such devices has: a first conductivity type well; opposite conductivity type source and drain regions disposed in the well; an insulating layer disposed over the well between the source and drain regions; a gate electrode disposed over the insulating layer between the source and drain regions; source, drain, and back gate electrodes connected to the source, drain and back gate regions, respectively; and first conductors arranged to connect the MOS devices as transistors for the circuit. A plurality of second MOS devices is formed in a region adjacent to the active device region. Each one of such second MOS devices has: the first conductivity type well; opposite conductivity type source and drain regions disposed in the well; a first conductive type region disposed in the well; an insulating layer disposed over the well between the source and drain regions; a gate electrode disposed over the insulating layer between the source and drain regions; source, drain, and back gate electrodes connected to the source, drain and back gate regions, respectively; and second conductors arranged to connect the plurality of second MOS devices as capacitors for the circuit. The second conductors electrically interconnect the source, drain and gate electrodes to provide a first plate for the capacitor and provide the gate electrode as a second plate for the capacitor. The second conductors electrically interconnect the source, drain and gate electrodes to provide a first plate for the capacitor and provide the gate electrode as a second plate for the capacitor.

BRIEF DESCRIPTION OF THE DRAWING

Other advantages of the invention, as well as the invention itself, will become more readily apparent when read together with the following detailed description taken together with the accompanying drawings, in which.

DESCRIPTION OF THE PREFERRED EMBODIMENTS

Figure 1:
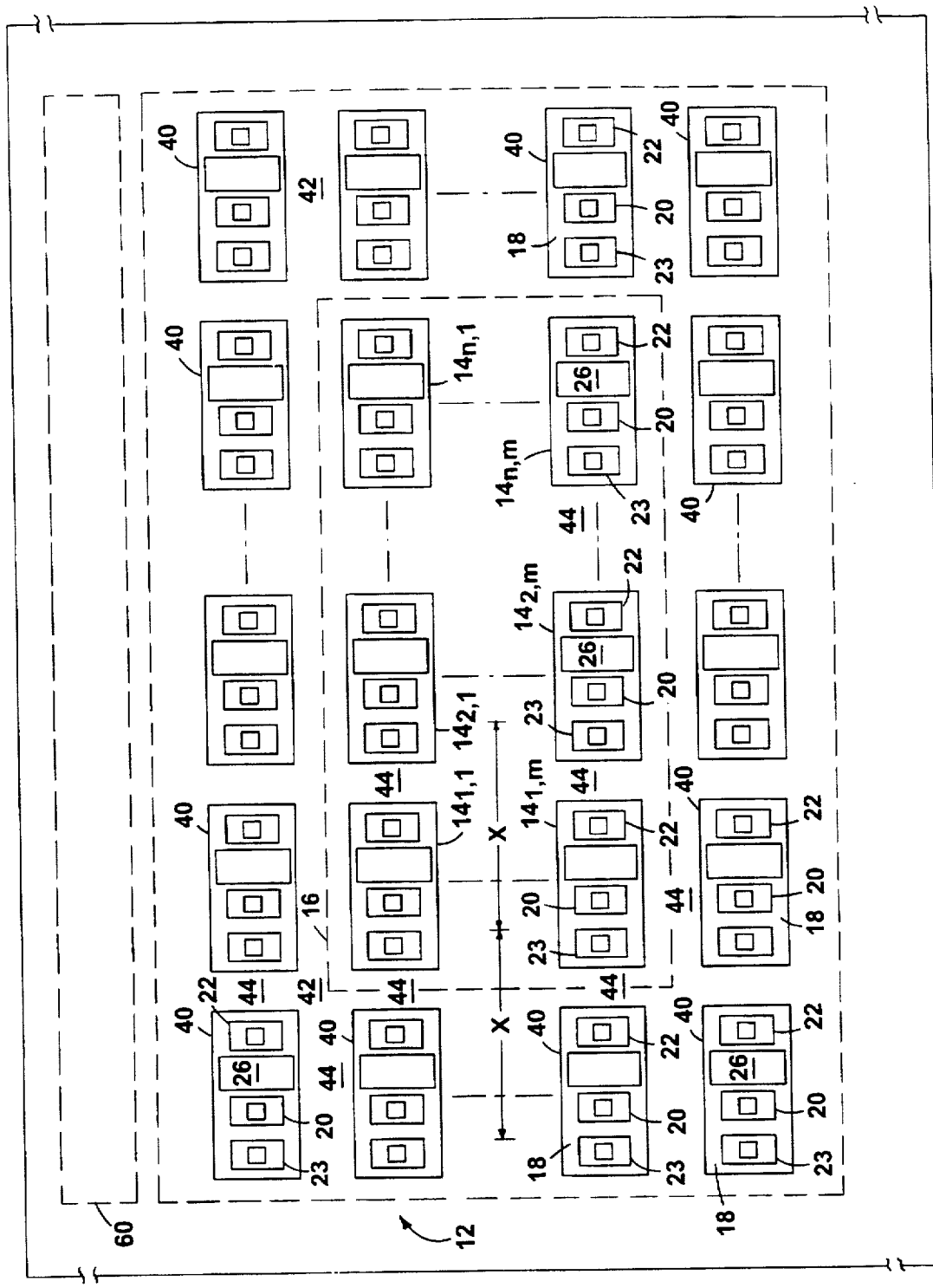
FIG. 1 is a diagrammatical plan view of an integrated circuit chip, such view showing an arrangement of devices prior to their electrical interconnection in accordance with the invention.
Figure 2:
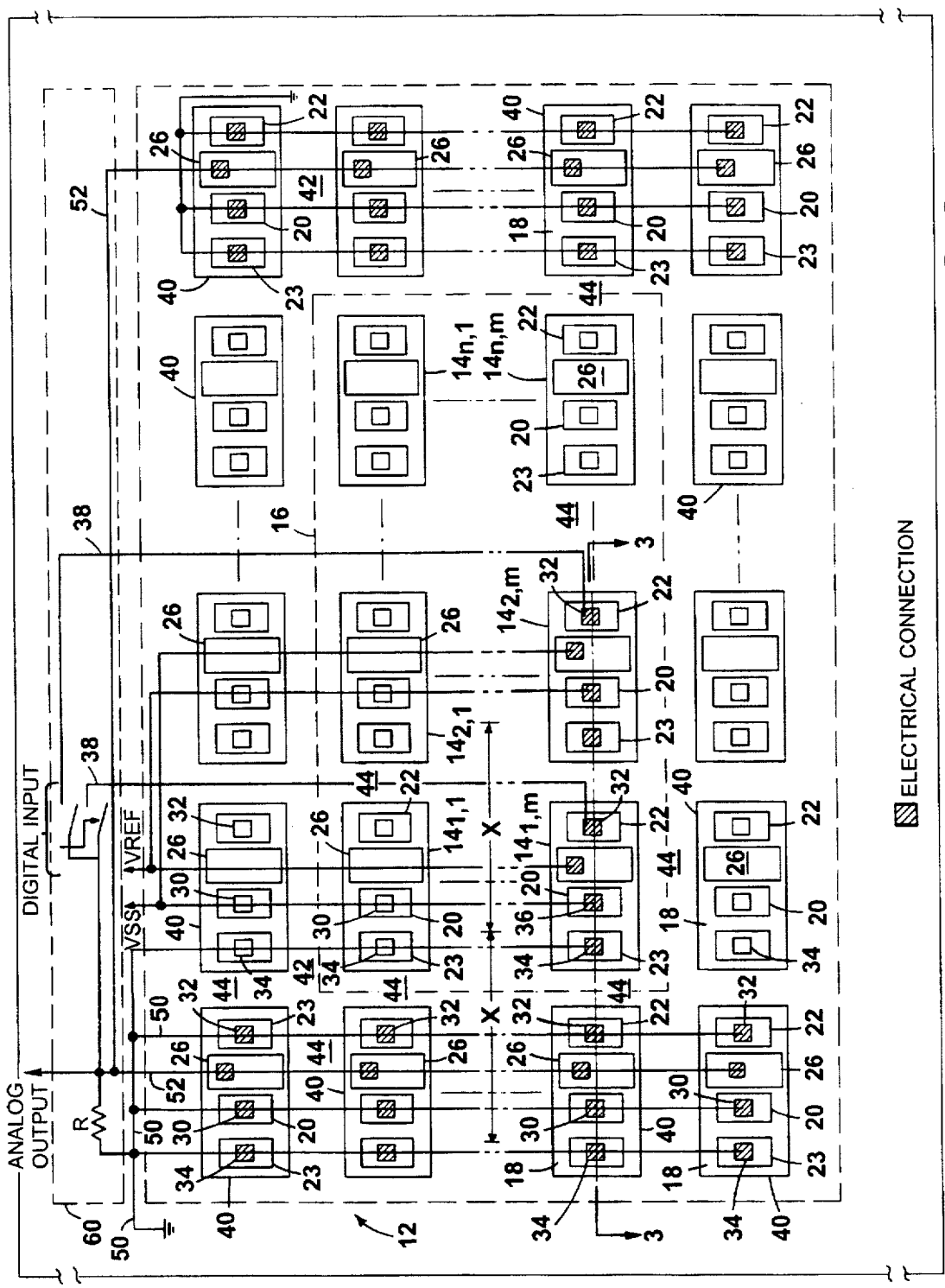
FIG. 2 is a diagrammatical plan view of the integrated circuit chip of FIG. 1 showing an exemplary portion of the devices thereof electrically interconnected in accordance with the invention.
Figure 3:
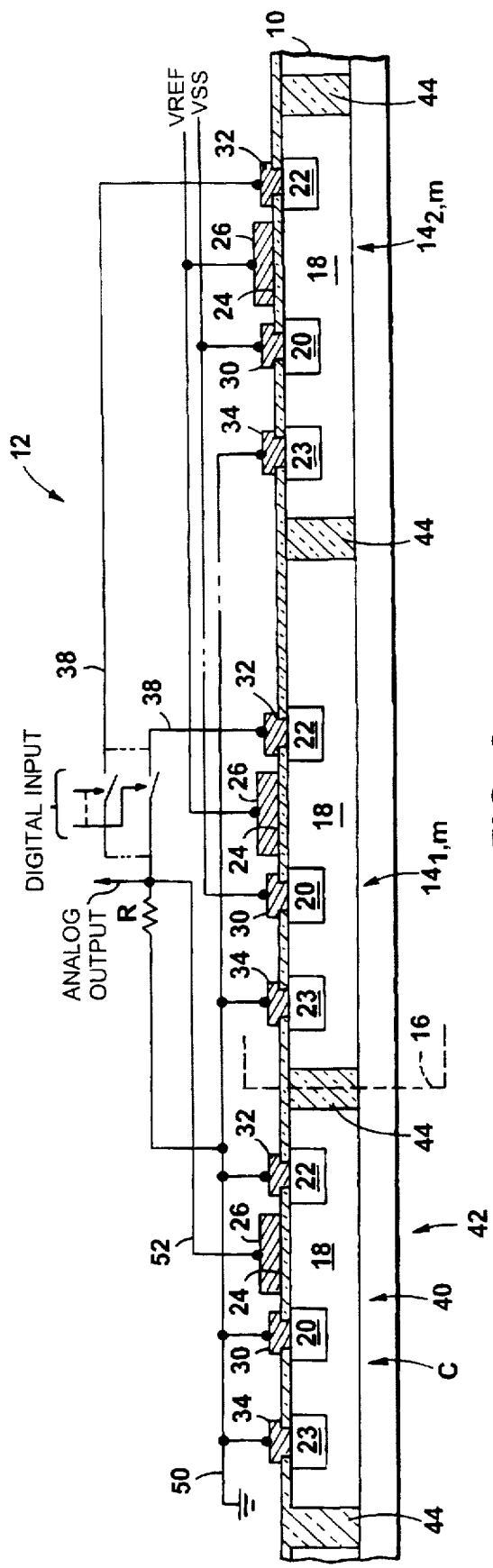
FIG. 3 is a diagrammatical, cross-sectional elevation view of a portion of the integrated circuit chip of FIG. 2 along line 3—3 after electrical interconnection of the devices in FIG. 1, such view being shown partially as a schematic diagram.
Figure 4:
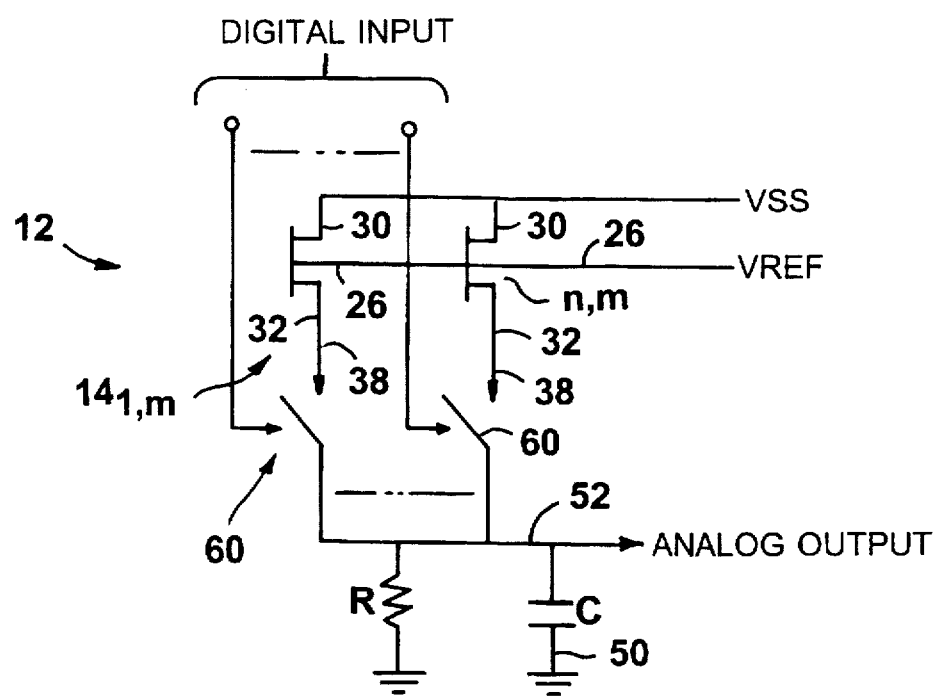
FIG. 4 is a schematic diagram of a circuit of the arrangement shown in FIG. 2.

Referring now to FIGS. 1, 2, and 3 an integrated circuit chip 10 having an electrical circuit 12, here a DAC (FIG. 4) formed therein is shown. The chip 10, here silicon, includes: a plurality of first MOS devices $14_{1,1}$–$14_{n,m}$ having matched electrical characteristic formed in a array of n columns and m rows of an active device region 16 of the chip 10. Each one of such first devices $14_{1,1}$–$14_{n,m}$ has a first conductivity type, here an $N^{31}$ type conductivity type well 18; opposite conductivity type (i.e., $P^{30}$ conductivity type) source and drain regions 20, 22, respectively, disposed in the well 18; a first type conductivity back-gate region 23 formed in the well 18 with a higher doping concentration than that of the well 18 (i..e., $N^{30}$); an insulating layer 24 (FIG. 2), here silicon dioxide, disposed over the well 18 between the source and drain regions 20, 22; a gate electrode 26, here doped polycrystalline silicon, disposed over the insulating layer 24 between the source and drain regions 20, 22, respectively; source, drain, and back gate electrodes 30, 32, 34 connected in ohmic contact to the source, drain and back gate regions, respectively; and first conductors 38 arranged to connect the MOS devices $14_{1,1}$–$_{n,m}$ as transistors for the circuit 12.

A plurality of second MOS devices 40 is formed in a region 42 adjacent to the active device region 16. More particularly, the region 40 is disposed about the outer periphery of active region 16, as shown in FIG. 1. Each one of the second MOS devices 40 is identical to the first MOS devices and thus includes: the first conductivity type ($N^{31}$) well 18; opposite conductivity type ($P^{30}$) source and drain regions 20, 22, respectively, disposed in the well 18; an $N^{30}$ conductivity type back-gate region 23, an insulating layer 24 (FIG. 2) (i.e., the silicon dioxide layer) disposed over the well 18 between the source and drain regions 20, 22; a gate electrode 26, here also doped polycrystalline silicon, disposed over the insulating layer 24 between the source and drain regions 20, 22; source, drain, and back gate electrodes 30, 32, 34, respectively, connected in ohmic contact to the source, drain and back gate regions, 20, 22, 23, respectively; and second conductors 50, 52 arranged to connect the plurality of second MOS devices 40 as capacitors for the circuit 12.

It is noted that the first and second MOS devices $14_{1,1}$–$14_{n,m}$, 40, respectively, are electrically isolated from each other by an insulator 44, here silicon dioxide, as shown. It is also noted that the first MOS devices $14_{1,1}$–$14_{n,m}$ are laterally separated from an adjacent one of the first MOS devices $14_{1,1}$–$14_{n,m}$ a predetermined distance, X. (That is columns of first MOS devices are separated by the predetermined distance, X, as shown). Further, the first MOS devices $14_{1,1}$–$14_{n,m}$ are connected as active devices (i.e., here as transistors to provide current sources for the DAC (FIG. 3)). It is also noted that each one of the second MOS devices 40 has the same shape and size as the first MOS devices $14_{1,1}$–$14_{n,m}$. The second MOS devices 40 are separated from an adjacent one of the first MOS devices 14 by the predetermined distance, X. Further, the second conductor 50 electrically interconnects the source, drain and gate electrodes 30, 32 and 34, respectively, of the second MOS devices 40 to provide a first plate for the capacitor and the second conductor 52 provides the gate electrode 26 as a second plate for the capacitor. The dielectric for the capacitor, C, is provided by the insulating layer 24 of the devices 40. The capacitors may be used as passive devices for the electrical circuit also formed on the chip. For example, the capacitors may serve as feedback capacitors for such electrical circuit, compensation capacitors, decoupling capacitors or filtering capacitors, as shown for the DAC in FIG. 4. (For example, in the DAC 12, FIG. 4, the second plate 52 of the capacitor C is connected to current summing resistor, R. Thus, digital input signals fed to switches 60 direct current from the current source transistors $14_{1,1}$–$14_{n,m}$ to the resistor R selectively in accordance with such digital signal. An analog output voltage, corresponding to the current selectively coupled to the summing resistor R is produced at the output of the resistor, R, as indicated. The output is filtered by the capacitor C provided by the capacitor connected second MOS devices 40). Still further, more than one row of the second capacitors may be provided with capacitors in adjacent rows being connected in parallel if additional capacitance is required.

It is also noted from FIG. 2, that while the second MOS devices 40 are disposed in columns to the left and right (i.e., on both sides of the active device region 16) as well as in rows above and below the active device region 14, here only the second MOS devices 40 in the columns are connected as capacitors.

Other embodiments are within the spirit and scope of the appended claims. For example, the source and drain electrode connections may be interchanged.

What is claimed is:

1. An integrated circuit chip having an electrical circuit formed therein, comprising:

a plurality of substantially identical devices formed in a region of the chip;

a first portion of the plurality of substantially identical devices being formed in an active device region of the chip, such first portion of the devices being connected as active devices for the electrical circuit;

a second portion of the plurality of substantially identical devices being disposed peripherally, and adjacent, to the active device region, a plurality of such second portion of the devices being electrically interconnected to form a passive device for the electrical circuit.

2. An integrated circuit chip having an electrical circuit formed therein, comprising:

a plurality of substantially identical devices formed in an array in the chip, such plurality of the devices having the same shape and size, such plurality of devices being laterally separated the same predetermined distance;

a first portion of the plurality of substantially identical devices being disposed in an active device region of the chip, such first portion of the devices being connected as active devices for the electrical circuit;

a second portion of the plurality of substantially identical devices being disposed peripherally, and adjacent, to the active region, a plurality of such second portion of the devices being electrically interconnected to provide a passive device for the electrical circuit.

3. An integrated circuit chip having an electrical circuit formed therein, comprising:

a plurality of substantially identical MOS devices disposed in an array in the chip;

a first portion of the plurality of substantially identical MOS devices being formed in an active device region of the chip, such first portion of the MOS devices being connected as transistors in the circuit;

a second portion of the plurality of substantially identical MOS devices being disposed peripherally, and adjacent, to the active device region, a plurality of such second portion of the MOS devices being electrically interconnected to form a capacitor in the circuit.

4. The integrated circuit chip recited in claim 3 wherein such plurality of substantially identical MOS devices are laterally separated the same predetermined distance, MOS devices being connected as active devices for the electrical, and wherein each one of the second portion of the MOS devices have the same shape and size as the first portion of the MOS devices.

5. An integrated circuit chip having an electrical circuit formed therein, comprising:

a plurality of substantially identical MOS devices formed in an array in a region of the chip;

a first portion of the plurality of substantially identical MOS devices being formed in an active device region of the chip, each one of such first portion of the MOS devices having a source electrode connected to a source region, a drain electrode connected to a drain region and a gate electrode disposed on an insulator disposed over a gate region, each one of such first portion of the MOS devices being connected as a transistor in the circuit;

a second portion of the plurality of substantially identical MOS devices being peripherally, and adjacent, to the active device region, each one of second portion of the MOS devices having a source electrode connected to a source region, a drain electrode connected to a drain region and a gate electrode disposed on an insulator disposed over a gate region, a plurality of such second portion of the MOS devices being electrically interconnected to provide a capacitor in the circuit, one plate of such capacitor being provided by electrically interconnecting the gate electrodes of the second plurality of MOS devices.

6. The integrated circuit chip recited in claim 5 wherein each one of such first portion of the MOS devices is laterally separated from an adjacent one of the first portion of the MOS devices a predetermined distance, and wherein each one of the second portion of the MOS devices has the same shape and size as each one of the first portion of the MOS devices, each one of such second portion of the MOS devices being separated from an adjacent one of the first portion of MOS devices by the predetermined distance.

7. An integrated circuit chip having an electrical circuit formed therein, such chip comprising:

a plurality of substantially identical MOS devices disposed in an array in a region of the chip;

a first portion of the plurality of substantially identical MOS devices having matched electrical characteristics formed an active device region of the chip, each one of such first portion of the MOS devices having:

a first conductivity type well;

opposite conductivity type source and drain regions disposed in the well;

a first conductive type region disposed in the well;

an insulating layer disposed over the well between the source and drain regions;

a gate electrode disposed over the insulating layer between the source and drain regions;

source, drain, and back gate electrodes connected to the source, drain and back gate regions, respectively; and first conductors arranged to connect the MOS devices as transistors for the circuit;

a second portion of the plurality of substantially identical MOS devices disposed peripherally, and adjacent, to the active device region, each one of such second portion of the MOS devices having:

the first conductivity type well;

second opposite conductivity type source and drain regions disposed in the well;

a first conductive type region disposed in the well;

an insulating layer disposed over the well between the source and drain regions;

a gate electrode disposed over the insulating layer between the source and drain regions;

source, drain, and back gate electrodes connected to the source, drain and back gate regions, respectively; and second conductors arranged to electrically interconnect a plurality of the second portion of the MOS devices as a capacitor for the circuit.

8. The integrated circuit chip recited in claim 7 wherein each one of such first portion of the MOS devices is laterally separated from an adjacent one of the first portion of the MOS devices a predetermined distance, and wherein each one of the second portion of the MOS devices has the same shape and size as the first portion of the MOS devices, each one of such second portion of the MOS devices being separated from an adjacent one of the first portion of the MOS devices by the predetermined distance.

9. The integrated circuit chip recited in claim 8 wherein the second conductors electrically interconnect the source, drain and back gate electrodes of the plurality of second MOS devices to provide a first plate for the capacitor and provide the gate electrodes as a second plate for the capacitor.

10. The integrated circuit chip recited in claim 7 wherein the second conductors electrically interconnect the source, drain and back gate electrodes to provide a first plate for the capacitor and provide the gate electrodes as a second plate for the capacitor.

11. An integrated circuit chip having an electrical circuit formed therein, comprising:

a plurality of substantially identical devices formed in an array of row and columns;

a first portion of such plurality of substantially identical devices being disposed in an active device region of the chip, such first portion of the devices being connected as active devices;

a second portion of the plurality of substantially identical devices being in a region disposed in a column adjacent to an outer peripheral column of the first portion of the devices formed in the active device region, a plurality of such second portion of the devices being electrically interconnected as a passive device.

12. The integrated circuit chip recited in claim 11 wherein the devices in the active device region have the same shape and size, such devices in the active device region being laterally separated from an adjacent one thereof a predetermined distance, such devices in the active device region being connected as active devices for the electrical circuit; and wherein such second portion of the devices have the same shape and size as the devices in the active device region, such second portion of the devices being separated from adjacent devices in the active device region by the predetermined distance, such second portion of the devices being electrically interconnected as a passive device for the electrical circuit.

13. The integrated circuit chip recited in claim 12 wherein the devices in the active device region comprise a plurality of first MOS devices, such first MOS devices being connected as transistors in the circuit; and wherein the second portion of the devices comprise a plurality of second MOS devices, such plurality of second MOS devices being electrically interconnected as a capacitor in the circuit.

14. The integrated circuit chip recited in claim 13 wherein such first MOS devices are laterally separated from an adjacent one of the first MOS devices a predetermined distance, such first MOS devices being connected as active devices for the electrical circuit, and wherein the second MOS devices have the same shape and size as the first MOS devices, such second MOS devices being separated from adjacent first MOS devices by the predetermined distance.

15. The integrated circuit chip recited in claim 14 wherein:

each one of such first MOS devices has a source electrode connected to a source region, a drain electrode connected to a drain region and a gate electrode disposed on an insulator disposed over a gate region, each one of such first MOS devices being connected as a transistor in the circuit; and each one of the plurality of second MOS devices has a source electrode connected to a source region, a drain electrode connected to a drain region and a gate electrode disposed on an insulator disposed over a gate region, one plate of such capacitor being provided by the gate electrode.

16. The integrated circuit chip recited in claim 15 wherein each one of such first MOS device is laterally separated from an adjacent one of the first MOS devices a predetermined distance, such first MOS devices being connected as active devices for the electrical circuit, and wherein each one of the second MOS devices has the same shape and size as each one of the first MOS devices, each one of such second MOS devices being separated from an adjacent of one the first MOS devices by the predetermined distance.

17. The integrated circuit chip recited in claim 11 wherein:

the devices in the active device region comprise: a plurality of first MOS devices having matched electrical characteristics formed in the active device region of the chip, each one of such devices having:
a first conductivity type well;
opposite conductivity type source and drain regions disposed in the well;
a first conductive type region disposed in the well;
an insulating layer disposed over the well between the source and drain regions;
a gate electrode disposed over the insulating layer between the source and drain regions;
source, drain, and back gate electrodes connected to the source, drain and back gate regions, respectively; and
first conductors arranged to connect the MOS devices and transistors for the circuit;

and the second portion of the devices comprise: a plurality of second MOS devices formed in a region adjacent to the active device region, each one of such second MOS devices having:
the first conductivity type well;
opposite conductivity type source and drain regions disposed in the well;
a first conductive type region disposed in the well;
an insulating layer disposed over the well between the source and drain regions;
a gate electrode disposed over the insulating layer between the source and drain regions;
source, drain, and back gate electrodes connected to the source, drain and back gate regions, respectively; and
second conductors arranged to electrically interconnect the plurality of the second portion of the MOS devices as the capacitor for the circuit.

18. The integrated circuit chip recited in claim 17 wherein each one of such first MOS devices is laterally separated from an adjacent one of the first MOS devices a predetermined distance, such first MOS devices being connected as active devices for the electrical circuit, and wherein each one of the second MOS devices has the same shape and size as the first MOS devices, each one of such second MOS devices being separated from an adjacent one of the first MOS devices by the predetermined distance.

19. The integrated circuit chip recited in claim 18 wherein the second conductors electrically interconnect the source, drain and back gate electrodes to provide a first plate for the capacitor and provide the gate electrode as a second plate for the capacitor.

20. The integrated circuit chip recited in claim 17 wherein the second conductors electrically interconnect the source, drain and back gate electrodes to provide a first plate for the capacitor and provide the gate electrode as a second plate for the capacitor.

21. A method for forming an integrated circuit chip, comprising the steps of:

forming a plurality of substantially identical devices in a region of the chip with a first portion of the substantially identical devices being formed in an active device region of the chip, such first portion of the devices being connected as active devices for an electrical circuit and a second portion of the plurality of substantially identical devices being formed peripherally, and adjacent, to the active device region;

electrically interconnecting a plurality of such second portion of the devices to form a passive device for the electrical circuit.

22. A method for forming an integrated circuit chip, comprising the steps of:

forming a plurality of substantially identical devices formed in an array of row and columns, a first portion of such substantially identical devices being formed in an active device region of the chip, such first portion of the devices being connected as active devices and a second portion of the plurality of substantially identical devices being formed in a region disposed of in a column adjacent to an outer peripheral column of the first portion of the devices formed in the active device region; and electrically interconnecting a plurality of such second portion of the devices as a passive device.

* * * * *